United States Patent [19]

Lillis et al.

[11] 4,065,725
[45] Dec. 27, 1977

[54] GAIN CONTROL CIRCUIT

[75] Inventors: William Joseph Lillis, Tempe; Paul Mike Henry, Chandler, both of Ariz.

[73] Assignee: Motorola, Inc., Schaumburg, Ill.

[21] Appl. No.: 714,727

[22] Filed: Aug. 16, 1976

[51] Int. Cl.² .......................... H03F 3/45; H03G 3/30
[52] U.S. Cl. .................................... 330/254; 330/285; 330/289; 358/27
[58] Field of Search .................. 330/29, 30 D, 23; 358/27

[56] References Cited

FOREIGN PATENT DOCUMENTS 1,320,910 6/1973 United Kingdom .............. 330/29 X Primary Examiner—Lawrence J. Dahl
Attorney, Agent, or Firm—Michael D. Bingham

[57] ABSTRACT

An electronic gain control circuit and method are disclosed for providing gain control. The gain control circuit is adaptable for use with differential amplifiers to control the gain thereof and is suitable to be fabricated in monolithic integrated circuit form. The gain control circuit utilizes voltages generated by currents established through diodes to obtain a differential gain voltage to linearly vary the gain of the amplifier. In a preferred form, the amplifier consists of first and second differentially connected transistor pairs with each pair commonly connected to a respective collector of an input differential stage. A constant current source supplies a constant current through a first diode string and is coupled to a common node between the transistor pairs for providing a fixed voltage thereat. Another common node between the transistor pairs that is coupled to the output transistors, is connected to a variable current drive circuit which is adapted to receive a gain control voltage for varying the current drive to the output transistors to vary the gain of the differential amplifier in a linear manner.

19 Claims, 2 Drawing Figures

VOLTAGE GAIN v $V_{EGC}$

GAIN CONTROL CIRCUIT

BACKGROUND OF THE INVENTION

The present invention relates to gain control circuits and more particularly to an electronic gain control circuit for varying the gain of differential amplifiers.

Of the prior art, the most significant manner presently utilized to gain control differential amplifiers is to shunt a portion of the input signal to ground in response to a control voltage. Although this is a very good method to electronically gain control solid state amplifiers, several disadvantages are related to this method.

The aforementioned gain control circuit requires the rationing of a large diffused resistor to a small diffused resistor. This is most difficult to achieve in typical fabrication processes used today without increasing costs significantly. As the ratio of the resistors is changed due to process tolerances, the amount of variance in gain of the differential amplifier in response to a gain control signal varies, which is undesirous. It is desired that the amount of change in gain per change in control bias be fixed and known.

Another problem arising from this ratioing of resistors occurs with changes in operating temperatures. As the effective resistances of the resistors vary with temperature, the ratio therebetween also varies. Hence, the amount of gain control will also vary with temperature. In a dynamic closed loop feedback system this would normally not be a problem. However, this prior art system cannot be advantageously used in open loop systems.

A further problem associated with the prior art is due to the fact that gain control is accomplished across the relative small resistor of the pair. Thus, the linearity of gain versus control suffers. Additionally, because the magnitude of the control voltage established across the small resistor is quite small, the amount of current split between differential transistor output pairs varies as a function of temperature which is also undesirous.

Thus, there is a need for an electronic gain circuit to overcome the above deficiencies of the prior art.

SUMMARY OF THE INVENTION

An object of the present invention is to provide an improved electronic gain control circuit.

Another object of this invention is to provide an improved electronic gain control circuit suitable to be used to control the gain of differential amplifiers which is particularly adaptable to be fabricated in monolithic integrated circuit form.

The foregoing and other objects are met by the present invention by providing a gain control circuit for varying the differential gain of a differential amplifier which is suitable to be fabricated in monolithic integrated form. According to a feature of the invention, the differential amplifier includes a differential input stage and first and second differentially coupled transistor pairs connected to respective outputs of the differential input stage. Respective ones of the transistor pairs are coupled to first and second common nodes. The gain control circuit comprises a reference circuit for establishing a substantially constant reference voltage at the first common node and a circuit coupled to the second common node for causing the conductivity of the output transistors of the respective transistor pairs to be varied in response to a gain control signal. Another feature of the present invention is that the gain control circuit utilizes voltages generated by currents established through diodes to obtain differential gain voltage to linearly vary the gain of the amplifier.

DETAILED DESCRIPTION OF THE INVENTION

Figure 1:
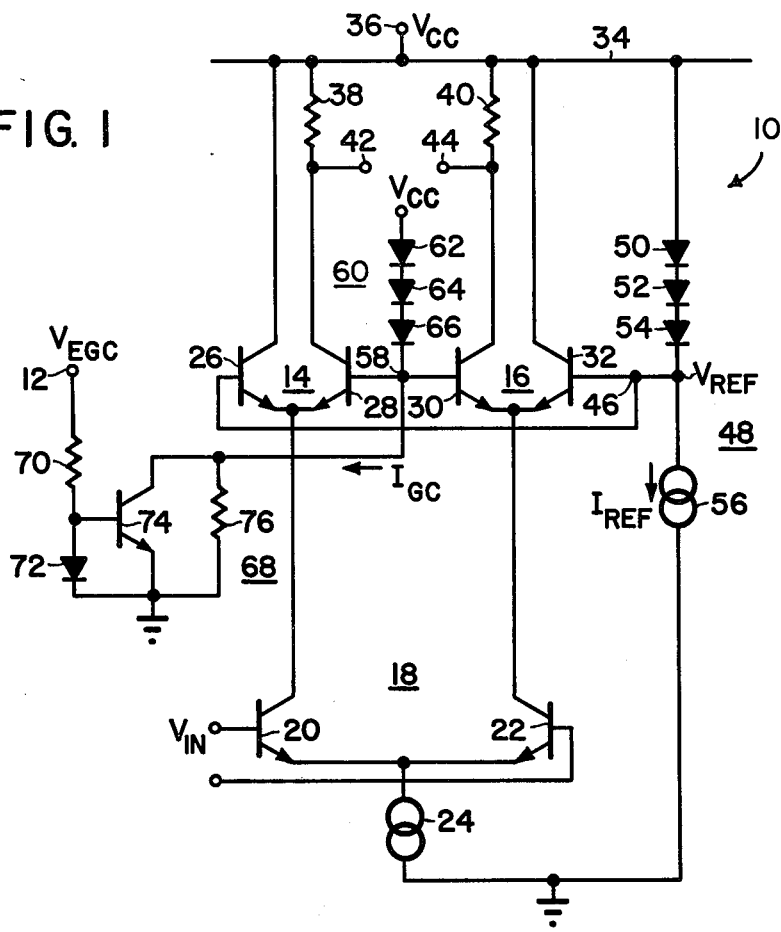
FIG. 1 is a schematic diagram of a differential amplifier including the gain control circuit of the preferred embodiment of the invention.

Referring to FIG. 1, there is illustrated differential amplifier circuit 10 which is suitable for being fabricated in monolithic integrated circuit form and adapted to receive a gain control voltage, $V_{EGC}$ at terminal 12. Differential amplifier 10 includes first and second differentially connected transistor pairs 14 and 16 which are coupled to differential input stage 18. Input stage 18 comprises input transistors 20 and 22 which are emitter coupled to current source 24 to ground. Current source 24 may utilize anyone of several known current circuits, for example, a T resistive network formed between the emitter electrodes of transistors 20 and 22 in series with a source transistor. The bases of transistors 20 and 22 are adapted to receive a differential input signal, for instance, therebetween.

The first differential pair 14 includes transistors 26 and 28 with the commonly connected emitters thereof being coupled to the collector of transistor 20. Likewise, transistor pair 16 including transistor 30 and 32 is commonly connected to the collector of transistor 22. The collectors of transistors 26 and 32 are tied directly to a power supply conductor 34 which receives a power supply voltage, $V_{CC}$ applied at terminal 36. The collectors of transistors 28 and 30 are coupled to power supply conductor 34 via respective load resistors 38 and 40. Differential output signals are derived at output terminals 42 and 44 which are connected to the respective collectors of transistors 28 and 30. The bases of transistors 32 and 26 are tied directly together at common junction point 46 at which is supplied a constant reference voltage. This reference voltage is provided by reference circuit 48 which includes diodes 50, 52, and 54 serially connected between power supply conductor 34 and junction 46. Constant current source 56 is connected between junction 46 and a second potential which in a preferred embodiment is ground. The bases of transistors 28 and 30 are connected to common junction 58. Diode reference chain 60, consisting of serially connected diodes 62, 64 and 66 is coupled between $V_{CC}$ and junction point 58. As will be explained, the current flowing into and out of node 58 is caused to vary in response to the applied gain control voltage, $V_{EGC}$, to vary the gain of differential amplifier 10.

Briefly, when differential input signals are applied to the bases of transistors 20 and 22, the current flow in differential pairs 14 and 16 is differentially controlled so that a differential output is developed across output terminals 42 and 44. By varying the relative conductivity of transistor 28 to transistor 26, and transistor 30 to transistor 32, the gain of the amplifier may be controlled. As an aside, because of the differential connection, nodes 46 and 58 are virtual grounds and therefore require no bypass capacitors.

To provide control of the gain of amplifier 10, there is provided gain control circuit 68. Control circuit 68 includes resistor 70 and diode 72 serially connected between terminal 12 and ground, transistor 74 and pinch resistor 76. The base of transistor 74 is connected to the junction point between resistor 70 and diode 72 with the emitter thereof connected to ground. Pinch resistor 76 is connected in parallel between the collector and emitter of transistor 74 with the common anode between the collector and the resistor being connected to node 58 of differential amplifier 10.

As previously mentioned, reference circuit 48 establishes a fixed voltage, $V_{REF}$, at the base of transistors 26 and 32. In operation, with full gain desired, $V_{EGC}$ is normally zero and the voltage at junction 58 is positive. The current, $I_{GC}$ is very much less than current $I_{REF}$ and transistors 28 and 30 are rendered fully on with respect to transistors 26 and 32. Hence, full gain is provided between the input and output of amplifier 10.

As $V_{EGC}$ is increased, $I_{GC}$ increases as transistor 74 begins to conduct. In response to transistor 74 being rendered conductive, the voltage at junction 58 begins decreasing or becoming less positive. Transistors 28 and 30 are then rendered decreasingly conductive and are gradually turned off. Thus, the gain of differential amplifier 10 gradually decreases. At a value when $I_{GC}$ becomes equal to $I_{REF}$, the current split between transistor pairs 28, 26 and 30, 32 is approximately equal. The gain will continue to linearly decrease with increasing gain control voltage until transistors 28 and 30 are fully off (minimum gain).

It is to be understood that the ratio of current split between each transistor of the differential transistor pairs may be varied by utilizing more or less diodes in diode chain 60 and reference circuit 48. As illustrated, using three diodes, a current ratio of 100:1 is obtained between the output transistors 28 and 30 being rendered full on and full off.

The significant improvement of the gain control circuit of the present invention over the prior art is the linearization and extension of the range of the gain control. The generation of voltages, by passing current through diodes, to vary the gain provides the linearity of the gain control function of the embodiment of the invention. Moreover, since the temperature variation of the gain control current, $I_{GC}$, can be matched to $I_{REF}$, the gain of differential amplifier 10 can be made substantially independent of temperature for a given range of $V_{EGC}$. Further, because of symmetry, variation in the power supply voltage has negligible effect on the gain of the amplifier.

Figure 2:
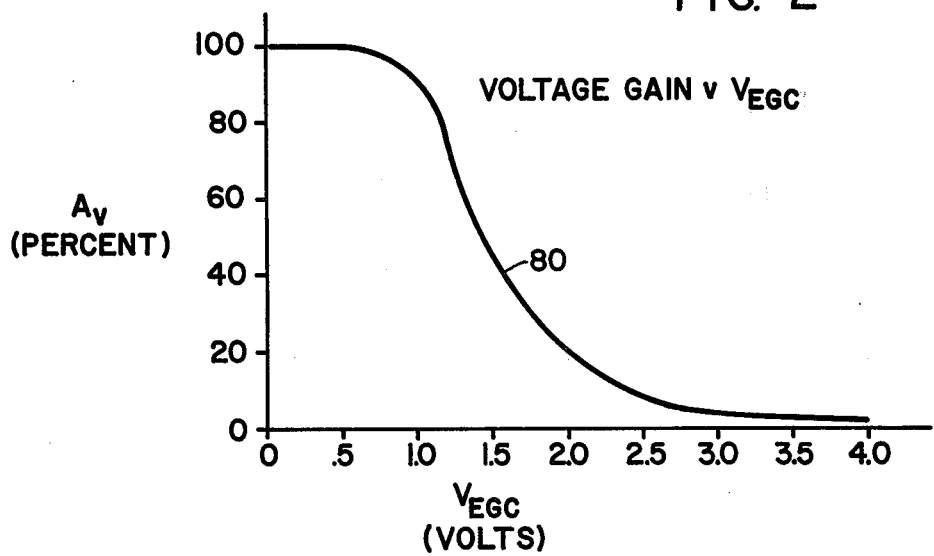
FIG. 2 is a curve illustrating normalized gain versus control voltage for the amplifier of the present invention.

Curve 80 of FIG. 2 shows a typical response of amplifier 10 to a gain control input signal. The curve is normalized and illustrates amplifier gain in percent versus the gain control voltage $V_{EGC}$. Typically, the gain of the foregoing described circuit can be varied over greater than a 60 dB range.

Thus, what has been described is an improved gain control amplifier circuit. The circuit provides an extended gain control range and linearization of the gain versus the control voltage. Moreover, the gain of the disclosed circuit is substantially independent of temperature and power supply variations.

What is claimed is:

1. A gain controlled amplifier including a differential input stage responsive to an input signal for deriving a differential output signal at first and second outputs, first and second differential output stages each having a first input interconnected to a first node, and each having a second input interconnected to a second node, the common terminal of each of the output stages being coupled to a respective output of the input differential stage, the improvement comprising:

a reference circuit means coupled to the first node including at least one electron control means for providing a reference voltage at the first node having a predetermined temperature characteristic; and gain control means coupled to the second node which is responsive to an applied gain control signal for causing the gain of the amplifier to vary in accordance with said applied gain control signal, said gain control means including at least one electron control means for causing the voltage appearing at the second node to have a substantially identical temperature characteristic as said reference voltage and to be varied in a linear fashion such that the gain of the amplifier is varied linearly in accordance with said applied gain control signal and the gain control characteristic is independent to variations in ambient temperature and power supply voltages.

2. The amplifier of claim 1 wherein said reference circuit means includes:

a plurality of serially connected electron control means, the first one of said electron control means being coupled to a first power supply potential, the last one of said electron control means being coupled to the first node; and current supply means coupled between the first node and a second power supply potential.

3. The amplifier of claim 2 wherein said electron control means are PN diodes, the anode of said first electron control means being connected to said first power supply potential, the cathode of said last electron control means being coupled to the first node.

4. The amplifier of claim 2 wherein said gain control means includes:

a plurality of electron means coupled between said first power supply potential and the second node; and means for varying the current through said electron control means in response to said gain control signal being applied thereto, said current varying means being coupled between the second node and said second power supply potential.

5. The amplifier of claim 4 wherein:

said plurality of electron control means being PN diodes; and said current varying means including an electron control means having first, second and control electrodes, said first electrode being coupled to said second power supply potential, said second electrode being coupled to the second node, resistive means coupled between said first and second electrodes and bias circuit means adapted to receive said gain control signal and having an output coupled to said control electrode of said electron control means.

6. A gain controlled differential amplifier including an input differential stage adapted to receive differential input signals and having first and second outputs, comprising in combination:

a first pair of electron control means each having first, second and control electrodes, said first electrodes of said first pair being commonly connected to the first output of the input differential stage, said second electrode of a first one of the electron control means of said first pair being directly connected to a source of operating potential, said second electrode of the second electron control means of said first pair being coupled to said source of operating potential and being a first output of the amplifier;

a second pair of electron control means each having first, second and control electrodes, said first electrodes of said second pair being commonly connected to the second output of the input differential stage, said second electrode of a first one of the electron control means of said second pair being directly connected to said source of operating potential, said second electrode of the second electron control means of said second pair being coupled to said source of operating potential and being a second output of the amplifier;

reference circuit means having an output and being coupled between said source of operating potential and a ground reference potential for providing a reference potential at said output having a predetermined temperature characteristic, said output being connected to said control electrodes of each of said first electron control means of said first and second pairs of electron control means; and circuit means having a control terminal and being coupled to said source of operating potential which is responsive to an applied gain control signal for producing an output signal to vary the conductivity of said second electron control means of said first and second pairs of electron control means to vary the gain of the amplifier, said control terminal being coupled to said control electrodes of each of said second electron control means of each pair of electron control means, said output signal having a predetermined temperature characteristic which is substantially matched to said temperature characteristic of said reference potential such that the gain control characteristic of the amplifier circuit is independent to temperature and operating potential variations.

7. The amplifier of claim 6 wherein said reference circuit means includes:

a plurality of serially connected electron control means each having first and second electrodes, a second electrode of a first one of said electron control means being coupled to said source of operating potential, the first electrode of the last one of said serially connected electron control means being connected to said output of said reference circuit means; and current source means coupled between said output of said reference circuit means and a second potential for providing a current through said plurality of electron control means.

8. The amplifier of claim 7 wherein:
said electron control means of said first and second pairs being NPN transistors; and
said plurality of electron control means of said reference circuit means being PN diodes.

9. The amplifier of claim 8 wherein said circuit means includes:

a plurality of serially connected electron control means each having first and second electrodes, the second electrode of the first one of said plurality electron control means being coupled to said source of operating potential, the first electrode of the last one of said plurality electron control means being connected to said control terminal; and additional circuit means having an input terminal adapted to receive said gain control signal and being connected to said control terminal for varying the magnitude of the current passing through said plurality electron control means in accordance with the gain control signal.

10. The amplifier of claim 9 wherein said additional circuit means includes:

resistive means coupled between said control terminal and said second potential;

electron control means having first, second and control means, said first electrode being connected to said second potential, said second electrode being connected to said control terminal; and other circuit means coupled between said input terminal and said second potential and having an output terminal connected to said control electrode of said electron control means.

11. The amplifier of claim 10 wherein:
said plurality of electron control means of said circuit means includes PN diodes; and
said electron control means of said additional circuit means being a NPN transistor.

12. The amplifier of claim 6 wherein said circuit means includes:

a plurality of serially connected electron control means each having first and second electrodes, the second electrode of the first one of said plurality of electron control means being coupled to said source of operating potential, the first electrode of the last one of said plurality of electron control means being connected to said control terminal; and additional circuit means having an input terminal adapted to receive said gain control signal and being connected to said control terminal for varying the magnitude of a voltage produced at said control terminal in accordance with the gain controlled signal said reference potential and said voltage produced by said circuit means having substantially the same temperature characteristic.

13. The amplifier of claim 12 wherein said additional circuit means includes:

resistive means coupled between said control terminal and said second potential;

electron control means having first, second and control means, said first electrode being connected to said second potential, said second electrode being connected to said control terminal; and other circuit means coupled between said input terminal in said second potential and having an output terminal connected to said control electrode of said electron control means.

14. The amplifier of claim 13 wherein:
said plurality of electron control means of said circuit means includes PN diodes; and
said electron control means of said additional circuit means being a NPN transistor.

15. A gain control circuit suitable to be fabricated in monolithic integrated circuit form for linearly varying the gain of a differential amplifier, the amplifier including a differential input stage, first and second differential transistor pairs coupled to the differential input stage and which include outputs of the amplifier and having respective ones of the base electrodes of each transistor pair connected at first and second common nodes, the gain control circuit comprising:

reference circuit means having an output terminal connected to the first one of the common nodes between said first and second differential transistor pairs including at least one semiconductor diode means for providing a reference potential at said output terminal thereof, said reference potential having a predetermined temperature characteristic; and circuit means adapted to receive a gain control signal and being coupled to the second common node including at least one semiconductor diode means for varying the gain of the amplifier in accordance to said gain control signal, said circuit means producing a voltage signal at the second common node having a predetermined temperature characteristic being matched to said temperature characteristics of said reference potential such that the charcteristics of the gain control circuit are substantially independent to temperature and operating potential variations, said at least one semiconductor diode means causing the gain of the amplifier to be linearly varied in response to the gain control signal being within a predetermined range.

16. The gain control circuit of claim 15 wherein said semiconductor diode means of said reference circuit means includes:

a plurality of serially connected electron control means each having first and second electrodes, the second electrode of the first one of said electron control means being connected to a source of operating potential, the first electrode of the last one of said electron control means being connected to said output terminal; and current source means coupled between said output terminal of said reference circuit means in a second potential for providing a current through said plurality of electron control means.

17. The gain control circuit of claim 16 wherein said semiconductor diode means of said circuit means includes:

a plurality of serially connected electron control means each having first and second electrodes, the second electrode of the first one of said plurality of electron control means being connected to said source of operating potential, the first electrode of the last one of said plurality of electron control means being connected to said second common node; and additional circuit means having an input terminal adapted to receive said gain control signal and being connected to said second common node for varying the magnitude of the current passing through said plurality of electron control means in accordance with the gain control signal.

18. The gain control circuit of claim 17 wherein said additional circuit means includes:

resistive means coupled between said second node and a second potential;

electron control means having first, second and control means, said first electrode being connected to said second potential, said second electrode being connected to said second, node; and other circuit means coupled between said input terminal and said second potential and having an output terminal connected to said control electrode of said electron control means.

19. In a differential amplifier including a differential input stage for receiving input signals, a first differential transistor pair coupled to an output of the input stage and having an output terminal, a second differential transistor pair coupled to another output of the input stage and having an output terminal the base electrodes of a first transistor of each transistor pair being coupled respectively to a first common node, the base electrodes of the second transistor of each transistor pair being coupled to a second common node, a method for varying the gain of the amplifier in response to a gain control signal, comprising the steps of:

establishing a current through a first plurality of serially connected electron control means to provide a reference potential having a predetermined temperature characteristic to the first common node; and varying the current through a second plurality of serially connected electron control means coupled to the second common node in response to the gain control signal for producing a voltage thereat having a substantially identical temperature characteristic as said reference potential to vary the conductivity of the transistors of the first and second transistor pairs such that the magnitude of the output signal appearing at the output terminals of the transistor pairs is varied, the gain control characteristic of the amplifier being independent to temperature variations.

* * * * *